(12) United States Patent
De Santi et al.

(10) Patent No.: US 6,187,683 B1
(45) Date of Patent: Feb. 13, 2001

(54) METHOD FOR FINAL PASSIVATION OF INTEGRATED CIRCUIT

(75) Inventors: Giorgio De Santi, Milan; Luca Zanotti, Agrate Brianza; Giuseppe Crisenza, Trezzo Sull'Adda, all of (IT)

(73) Assignee: SGS-Thomson Microelectronics S.r.l., Agrate Brianza (IT)

( * ) Notice: Under 35 U.S.C. 154(b), the term of this patent shall be extended for 0 days.

(21) Appl. No.: 09/059,740

(22) Filed: Apr. 14, 1998

(30) Foreign Application Priority Data

Apr. 15, 1997 (EP) .................................................. 97830173

(51) Int. Cl.[7] ................................................. H01L 21/311
(52) U.S. Cl. .......................... 438/697; 438/624; 438/626; 438/692; 438/712; 438/788
(58) Field of Search .................................... 438/778, 624, 438/626, 692, 697, 712, 788; 257/634, FOR 634

(56) References Cited

U.S. PATENT DOCUMENTS

| | | | |
|---|---|---|---|
| 4,892,753 | 1/1990 | Wang et al. | 437/38 |
| 5,250,843 | 10/1993 | Eichelberger | 257/692 |
| 5,260,236 | 11/1993 | Petro et al. | 437/241 |
| 5,306,946 | 4/1994 | Yamamoto | 257/640 |
| 5,494,854 | * 2/1996 | Jain | 438/692 |
| 5,512,514 | * 4/1996 | Lee | 438/626 |
| 5,560,802 | * 10/1996 | Chisholm | 438/624 |
| 5,565,247 | 10/1996 | Suzuki | 427/562 |
| 5,641,712 | * 6/1997 | Grivna et al. | 438/624 |
| 5,650,359 | * 7/1997 | Ahlburn | 438/624 |
| 5,686,356 | * 11/1997 | Jain et al. | 438/624 |
| 5,698,467 | * 12/1997 | Sakao et al. | 438/624 |
| 5,705,028 | * 1/1998 | Matsumoto | 438/623 |
| 5,716,890 | * 2/1998 | Yao | 438/624 |
| 5,721,172 | * 2/1998 | Jang et al. | 438/424 |
| 5,728,621 | * 3/1998 | Zheng et al. | 438/424 |
| 5,885,894 | * 3/1999 | Wu et al. | 438/624 |
| 5,976,993 | * 11/1999 | Ravi et al. | 438/788 |

FOREIGN PATENT DOCUMENTS

| | | | |
|---|---|---|---|
| 0 497 541 A1 | 8/1992 | (EP) | H01L/21/316 |
| 0611129 | 8/1994 | (EP) | H01L/21/58 |
| 0 641 013 A2 | 3/1995 | (EP) | H01J/37/32 |
| 97830174 | 10/1998 | (EP) . | |

OTHER PUBLICATIONS

Robert C. Weast et al. "CRC Handbok of Chemistry and Physics", p. D.–146, Aug. 2, 1989.*
European Search Report from European patent application No. 97 830174, filed Apr. 15, 1997.
High–Density Plasma CVD and CMP for 0.25–M intermetal Dielectric Processing, Pye, J.T. et al., Solid State Technology, vol. 38, No. 12, Dec. 1995, pp. 65–71, XP000542745.
European Search Report from application No. 97 830173, filed Apr. 15, 1997.
Patent Abstracts of Japan; vol. 018, No. 266 (E–1551), May 20, 1994 & JP 06 045313; Feb. 18, 1994.

* cited by examiner

Primary Examiner—Carl Whitehead, Jr.
Assistant Examiner—Maria Guerrero
(74) Attorney, Agent, or Firm—Wolf, Greenfield & Sacks, P.C.; James H. Morris; Theodore E. Galanthay

(57) ABSTRACT

A planarization method is disclosed to provide improved protection against cracking of the final passivation layer of integrated circuit devices. In one embodiment, such method includes final passivation of an integrated circuit device including at least one integrated circuit chip. Such final passivation includes the step of forming a layer of protective material over a top surface of the integrated circuit chip, and a subsequent step of planarizing such layer of protective material to obtain a protection layer having a substantially flat top surface.

14 Claims, 1 Drawing Sheet

METHOD FOR FINAL PASSIVATION OF INTEGRATED CIRCUIT

RELATED APPLICATIONS

The following application is related to the present application and is incorporated herein by reference: European application no. 97830174.5.

BACKGROUND OF THE INVENTION

1. Field of the Invention

The present invention relates generally to methods for protecting semiconductor integrated circuits against mechanical stress or chemical agents and, more particularly, to methods for forming a passivation layer on such circuits to provide such protection.

2. Discussion of the Related Art

Semiconductor integrated circuits (hereafter referred to as chips) manufactured with Large Scale Integration technologies (LSI, VLSI, ULSI, and the like) typically are covered by a protective layer to protect against mechanical stress and aggressive chemical agents. This protective layer, referred to herein as the final passivation layer, typically is formed of silicon-based dielectric materials, such as silicon dioxide (USG), phosphorus-doped or fluorurate-doped silicon oxide (PSG or FSG), silicon nitrides and nitride oxides (SiOxNy, Si3N4).

The final passivation layer is conventionally formed by use of Chemical Vapor Deposition (CVD) techniques, either the plasma-enhanced CVD technique (PECVD) or the atmospheric pressure CVD technique (APCVD). The top surface of the final passivation layer formed by conventional techniques generally is not planar, having protrusions and depressions caused by gaps in the underlying layers (for example, gaps between metal lines of the uppermost metal interconnection layer). Such a non-planar top surface is disadvantageous because, when the chip is encapsulated in a package, the mechanical stress exerted by the package on the chip generally is not uniformly distributed over the top surface of the final passivation layer. Such non-uniform distribution of stress can lead to cracks in the final passivation layer, through which chemical agents or water molecules can penetrate and reach the underlying layers of the chip.

Therefore, what is needed is a method for protecting chips against such cracking due to non-uniform distribution of stress over the top surface of the final passivation layer.

SUMMARY OF THE INVENTION

According to the present invention, the aforementioned need is met by a process of final passivation, including planarization, of an integrated circuit device including at least one chip. Such process includes the steps of forming a final passivation layer over a top surface of the integrated circuit, and planarizing (that is, making substantially flat) the final passivation layer to obtain a substantially flat (hereafter, planar) top surface thereof.

Preferably, the planarizing step is performed by use of a Chemical Mechanical Polishing (CMP) technique. CMP is a technique already known in the field of integrated circuit manufacturing, where it is used to planarize inter-metal dielectric layers (i.e., dielectric layers provided between superimposed metal layers to electrically isolate one from the other). Alternatively, the planarizing step may be performed in accordance with a Reactive Ion Etching (RIE) technique, which is another technique already employed in the field of integrated circuit manufacturing for selectively removing layers of material.

The step of forming the final passivation layer in accordance with the present invention advantageously includes a conventional chemical vapor deposition of a suitable material, as described below, either by plasma-enhanced CVD or CVD at atmospheric pressure. In a preferred embodiment of the invention, the formation of the final passivation layer is performed in accordance with the so-called High-Density Plasma CVD (HDPCVD) technique, a known deposition technique for the formation of inter-metal dielectric layers in integrated circuits of very small geometries. The use of HDPCVD for forming the final passivation layer allows for a better filling of gaps in the underlying layers.

The planarizing step is particularly advantageous in the case of multichip devices, i.e., devices including two or more distinct chips encapsulated in the same package. In accordance with conventional techniques, not only does the final passivation layer of each chip typically have depressions and protrusions, but the top surfaces of the final passivation layers of the different chips generally are at different heights, due to the fact that each chip generally has a different thickness from the others. The present invention, which includes a planarizing step applied to the final passivation layer covering the multichip device, provides that the top surfaces of the final passivation layers of the different chips are at the same height.

Advantageously, such planarization of the final passivation layer, both with respect to single chips and multiple chips, generally increases the uniformity of mechanical stresses typically imposed by the packaging on the top surface of the final passivation layer, as compared to imposition of such stresses on final passivation layers that have not been so planarized. Such uniformity of stresses generally reduces cracks in the final passivation layer that may act as sites for penetration by chemical agents, water molecules, or other substances.

BRIEF DESCRIPTION OF THE DRAWINGS

The features and advantages of the present invention will be made more evident by the following detailed description of some particular embodiments thereof, illustrated as non-limiting examples in the drawings, wherein.

DETAILED DESCRIPTION

Figure 1:
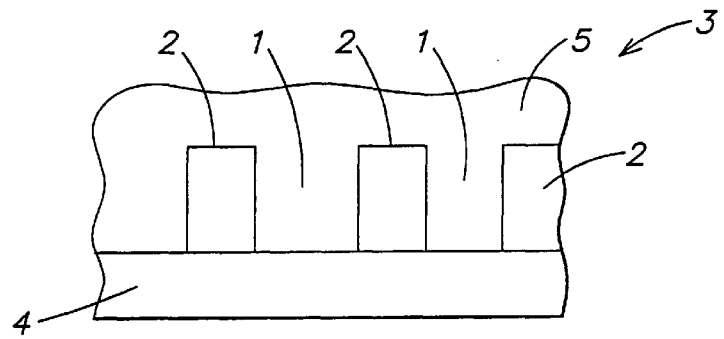
FIG. 1 is a schematic cross-sectional view of a chip after a final passivation layer has been formed thereupon.

The attributes of the present invention and its underlying method will now be described in greater detail in reference to preferred embodiments of the invention. In FIG. 1, a portion of an integrated circuit chip 3 is schematically shown in cross-section. The chip includes a substrate 4, over which illustrative metal lines 2 are formed. Between the metal lines 2, gaps 1 are formed. The chip is covered by a final passivation layer 5 of a suitable protective material. Suitable protective materials conventionally used in the integrated circuit manufacturing industry for final passivation layers include silicon dioxide (USG), phosphorus-doped or fluorurate-doped silicon oxide (PSG or FSG), silicon nitrides and nitride oxides (SiOxNy, Si3N4). It will be understood that the present invention is not so limited, however, and that any suitable protective material, now known or developed in the future, may be used.

Conventionally, the passivation layer is formed in accordance with a Chemical Vapor Deposition (CVD) technique, either Plasma-Enhanced (PECVD) or at Atmospheric Pressure (APCVD). Such conventional techniques generally are suitable for integrated circuits with geometries that are not extremely small. If the scale of integration is increased, and the gaps 1 become as narrow as approximately 0.8 μm, a so-called "Dep(osition)-Etch(ing)-Dep(osition)" technique is preferably used to form the passivation layer. This technique provides for a first deposition of only a part of the total thickness of the passivation layer, for example by PECVD, followed by an isotropic neutral ion sputter-etch (typically argon), and then an additional PECVD deposition to fill the gaps 1.

If the scale of integration is increased further, so that the gaps 1 become still narrower, for example, narrower than approximately 0.5 μm, conventional PECVD, APCVD and Dep-Etch-Dep techniques generally do not allow for the passivation layer 5 to completely fill the gaps. In this case it is preferable to use another deposition technique, referred to as HDPCVD. Such technique is known in the integrated circuit manufacturing industry for the formation of inter-metal dielectric thin films. HDPCVD is advantageously used for forming the passivation layer because it provides for a better filling of the gaps. The passivation layer may also be formed by a stack of layers, the lowermost formed in accordance with the HDPCVD technique, and the superimposed layers formed by conventional PECVD or APCVD techniques. The application of HDPCVD to the formation of final passivation layers forms the object of European application number 97830174.5, which is incorporated herein by reference in its entirety.

As shown in FIG. 1, after the final passivation layer 5 has been deposited, the top surface thereof generally is not planar because it has depressions and protrusions caused by the presence of gaps in the underlying layers, in this example the metal lines 2. According to the present invention, such final passivation layer 5 is submitted to a planarizing process to eliminate the protrusions and depressions from its top surface. Preferably, the thickness of the final passivation layer 5 prior to the planarizing step is at least equal to approximately 2 μm.

Such a planarization process may, for example, include a Chemical Mechanical Polishing (CMP) process. In accordance with such process, the semiconductor wafer to which the integrated circuit belongs is mounted with its front surface in contact with a pad and the rear surface with a rotary head. The rotary motion of the head, together with the pressure of the head biasing the wafer into contact with the pad, and the action of an abrasive powder ("slurry"), enable the removal of a thickness of the final passivation layer 5 ranging from 0.3 to 0.8 μm. Typically, the head pressure is in the range 1–4 PSI, and the rotation speed is in the range 40–80 rpm. Typically, a slurry of PH of approximately 9.5 to 11.5 is used, and it is supplied at a flow rate of 100–300 ml/min. The resulting polishing rate typically varies between 200 to 700 nm/min, so that a polishing time of approximately 40 to 100 seconds generally is sufficient to achieve the desired planarization.

Also, the planarization process may, for example, include a Reactive Ion Etching (RIE) process. According to such process, the desired planarization of the final passivation layer typically is achieved by the complete etch back of sacrificial materials, such as Spin-On-Glass (SOG) materials or photoresist, by way of Reactive Ion Etching. More particularly, after the final passivation layer 5 is deposited, a film of SOG of thickness typically ranging from approximately 0.4 to 1 μm is deposited over the final passivation layer. The SOG film is then completely etched away by reactive ion etching, and also the final passivation layer 5 is partially etched away to achieve a planar top surface thereof. The preferred process conditions are the following: for the reactive ion etching, a CF4/CHF3 chemistry is chosen, with a total gas flow of approximately 100 to 300 sccm at a pressure of approximately 100–400 mTorr; and the plasma power ranges from approximately 300 to 600 W.

Figure 2:
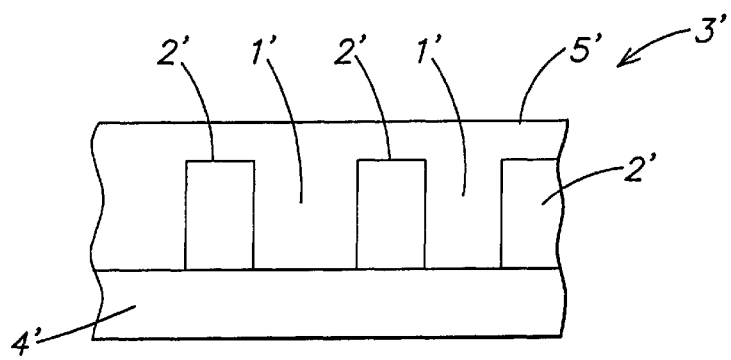
FIG. 2 is a schematic cross-section of the chip of FIG. 1 after the final passivation layer has been planarized in accordance with the present invention.

FIG. 2 is a schematic representation of chip 3 of FIG. 1, including final passivation layer 5, after such passivation layer is planarized in accordance with the present invention. As shown in FIG. 2, the top surface of final passivation layer 5' is planar. As noted, such planar surface is advantageous because, when chip 3' is encapsulated in a package (not shown), the interaction between chip 3' and the package is less likely to result in cracks in final passivation layer 5' as compared to such an interaction between chip 3 of FIG. 1 and such package. That is, the mechanical stress exerted by the package on chip 3' generally is uniformly distributed over the entire, planar, surface of final passivation layer 5'. In contrast, if protrusions existed on the surface of the passivation layer, as in passivation layer 5 FIG. 1, the mechanical stress would be exerted over said protrusions, with the risk of cracks in passivation layer 5 that may act as sites of penetration of chemical agents and water molecules. The advantage of such a planar surface typically is especially important with respect to ultra-thin packages (UTSOP) because the thin packaging is particularly likely to introduce mechanical stresses over a non-planar surface.

Figure 3:
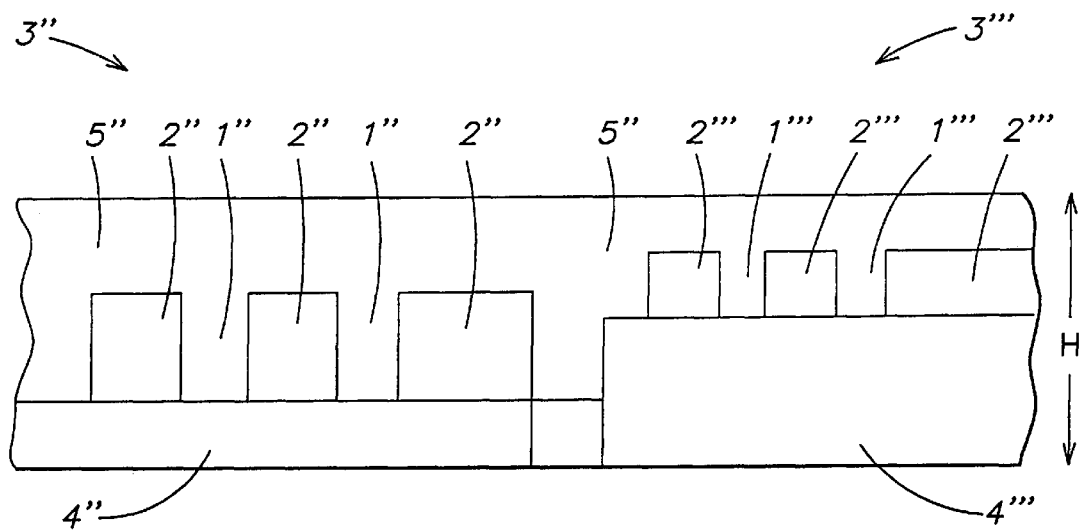
FIG. 3 is a schematic cross-section of a multichip device having a final passivation layer formed and planarized in accordance with the present invention.

FIG. 3 schematically shows a particularly advantageous application of the process according to the invention. In FIG. 3, it is assumed for illustrative purposes that two integrated circuits, chips 3" and 3'", are to be encapsulated in the same package (not shown) to form a multichip device. Such chips may be formed in the same semiconductor wafer, so that they are not physically separated, or, alternatively, they may be physically separated chips that are mounted on a same common base of the package. Typically, such chips 3" and 3'" have substrates 4" and 4'", respectively, of different heights. Generally such heights depend on the number of different layers of material making up such substrates, or other factors. As a consequence, if a conventional final passivation layer were to be formed over the multichip structure, such layer typically would have depressions or protrusions, or both, not only above each single chip (due, for example, to gaps 1" and 1'" between the underlying metal lines 2" and 2'"), but also between the chips. Such depressions or protrusions typically would form between the chips due to the different thickness of the substrates.

According to the present invention, a final passivation layer is formed over the whole multichip device. Such layer, which typically is non-planar, is then submitted to a planarization process, as described above, resulting in final passivation layer 5" that is planar. As noted, such planarization process not only substantially eliminates depressions and protrusions in the final passivation layer over each chip, but also substantially eliminates the difference in height of the passivation layer over the different chips. Thus, the top surface of passivation layer 5" over the whole multichip structure will therefore be approximately at the same height H. Such planar surface generally avoids the non-uniform application of mechanical stresses by the package on the various chips of the multichip device.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process of final passivation of an integrated circuit device comprising at least one chip, said process comprising the steps of:
    forming a final passivation layer over a top surface of said at least one chip, said forming step comprising a High-Density Plasma Chemical Vapor Deposition (HDPCVD) of a protective material; and
    planarizing a top surface of said final passivation layer;
    said planarization step comprising one of a chemical mechanical polishing (CMP) and a reactive ion etching (RIE) of said top surface of said final passivation layer.

2. The process according to claim 1, wherein:
    said integrated circuit device comprises a plurality of said chips;
    said forming step comprises the forming of a common final passivation layer over said plurality of said chips; and
    said planarizing step comprises the planarizing of said common final passivation layer.

3. The process according to claim 1, wherein:
    said final passivation layer prior to said planarizing step is at least approximately 2 $\mu$m thick.

4. The process according to claim 1, wherein:
    said final passivation layer comprises a stack of layers.

5. The process according to claim 1, wherein:
    (said planarizing step comprises a chemical mechanical polishing (CMP) of said top surface of) said final passivation layer is formed without any other layer being formed thereover.

6. The process according to claim 1, wherein:
    said forming step further comprises a first Chemical Vapor Deposition (CVD) of a first thickness of said final passivation layer, followed by a partial etching of said first thickness of said final passivation layer and by a second CVD of a second thickness of said final passivation layer.

7. The process according to claim 4, wherein:
    said stack of layers comprises a lowermost layer formed in accordance with said HDPCVD.

8. The process according to claim 2, wherein:
    said integrated circuit device comprises a semiconductor wafer having a front surface mounted in contact with a pad and having a rear surface in contact with a rotary head, said rotary head biasing said wafer into contact with said pad; and
    said CMP of said planarizing step comprises:
        rotating said head at a speed in a range of approximately 40 rpm to approximately 80 rpm;
        pressing said head against said wafer at a pressure in a range of approximately 1 PSI to approximately 4 PSI; and
        introducing a slurry, having a PH in a range of approximately 9.5 to 11.5, between said pad and said wafer at a flow rate in a range of approximately 100 ml/min to approximately 300 ml/min.

9. The process according to claim 5, wherein:
    said RIE etching of said planarizing step comprises:
        after said forming step and prior to said planarizing step, applying a sacrificial material having a thickness in a range between approximately 0.4 $\mu$m to 1 $\mu$m to said top surface of said final passivation layer; and
        etching away said sacrificial material and a portion of said final passivation layer by reactive ion etching having a CF4/CHF3 chemistry, a total gas flow in a range of approximately 100 sccm to 300 sccm at a pressure in a range of approximately 100 mTorr to 400 mTorr, and a plasma power in a range of approximately 300 W to 600 W.

10. The process according to claim 6, wherein:
    said first CVD is a PECVD.

11. The process according to claim 6, wherein:
    said partial etching comprises an isotropic neutral ion sputter-etch.

12. The process according to claim 7, wherein:
    said stack of layers further comprises at least one layer above the lowermost layer formed in accordance with a Plasma-Enhanced Chemical Vapor Deposition (PECVD).

13. The process according to claim 7, wherein:
    said stack of layers further comprises at least one layer above the lowermost layer formed in accordance with an Atmospheric Pressure Chemical Vapor Deposition (APCVD).

14. The process according to claim 13, wherein:
    said stack of layers further comprises at least one layer above the lowermost layer formed in accordance with an Atmospheric Pressure Chemical Vapor Deposition (APCVD).

* * * * *